United States Patent [19]
Fletcher et al.

[11] Patent Number: 4,823,952
[45] Date of Patent: Apr. 25, 1989

[54] MODULAR PACKAGING SYSTEM, PARTICULARLY FOR ELECTRONICS

[75] Inventors: William E. Fletcher, Nashua, N.H.; Charles M. Ault, Winchester; Dennis O. Sawyer, Tyngsboro, both of Mass.

[73] Assignee: Termiflex Corporation, Merrimack, N.H.

[21] Appl. No.: 518,365

[22] Filed: Jul. 29, 1983

[51] Int. Cl.⁴ .................. B65D 83/48; B65D 73/02; B65D 21/02
[52] U.S. Cl. ................... 206/328; 206/454; 206/519; 220/4 C; 220/4 D
[58] Field of Search ............... 220/4 C, 4 D, 5 A; 206/454, 519, 328

[56] References Cited

U.S. PATENT DOCUMENTS

| | | | |
|---|---|---|---|
| 2,865,499 | 12/1958 | Brogren | 220/4 C |
| 2,879,917 | 3/1959 | Flack | 206/519 |
| 2,895,599 | 7/1959 | Moyer | 206/454 |
| 2,898,522 | 8/1959 | Handen | |
| 2,923,400 | 2/1960 | Craig | 220/4 C |
| 3,141,998 | 7/1964 | Silkman | |
| 3,202,955 | 8/1965 | McKee | |
| 3,258,649 | 6/1966 | Arguin | |
| 3,384,956 | 5/1968 | Flanders et al. | |
| 3,639,809 | 2/1972 | Phlieger, Jr. | |
| 3,655,034 | 4/1972 | Stollman | 206/454 |
| 3,714,515 | 1/1973 | Lee | |
| 4,053,943 | 10/1977 | Galvin | |

FOREIGN PATENT DOCUMENTS

| | | | |
|---|---|---|---|
| 1545867 | 10/1968 | France | 220/4 C |
| 1072502 | 6/1967 | United Kingdom | 220/5 A |
| 1174237 | 12/1969 | United Kingdom | 220/5 A |

Primary Examiner—George E. Lowrance
Attorney, Agent, or Firm—F. Eugene Davis Davis IV

[57] ABSTRACT

A front cover is provided with an open area to accommodate visual displays, keyboards, switches, joy sticks and the like. A back cover, nestingly interfitting therewith, is closed, but provided with a recess, encompassing most of its back area. One or more identical nestingly interfitting intermediate frames may be nested and stacked between the back cover and the front cover to form a package of any desired volume. The frames, back cover, and front cover are provided with means for mounting functional elements such as electrical circuit boards. The front cover and intermediate frames are provided with peripheral circumferential ribs. These ribs, and the slots therebetween, provide for a great variety of ways to mount the package, as does the rear recess in the back plate. The front cover may be identical or nearly identical to the intermediate frames. Functional elements may be mounted to the covers and frames during manufacture such that the covers and frames act as protective carriers during manufacture. After assembly, they provide a close package or case for the assembled unit.

14 Claims, 12 Drawing Sheets

FIG. 13
FIG. 14
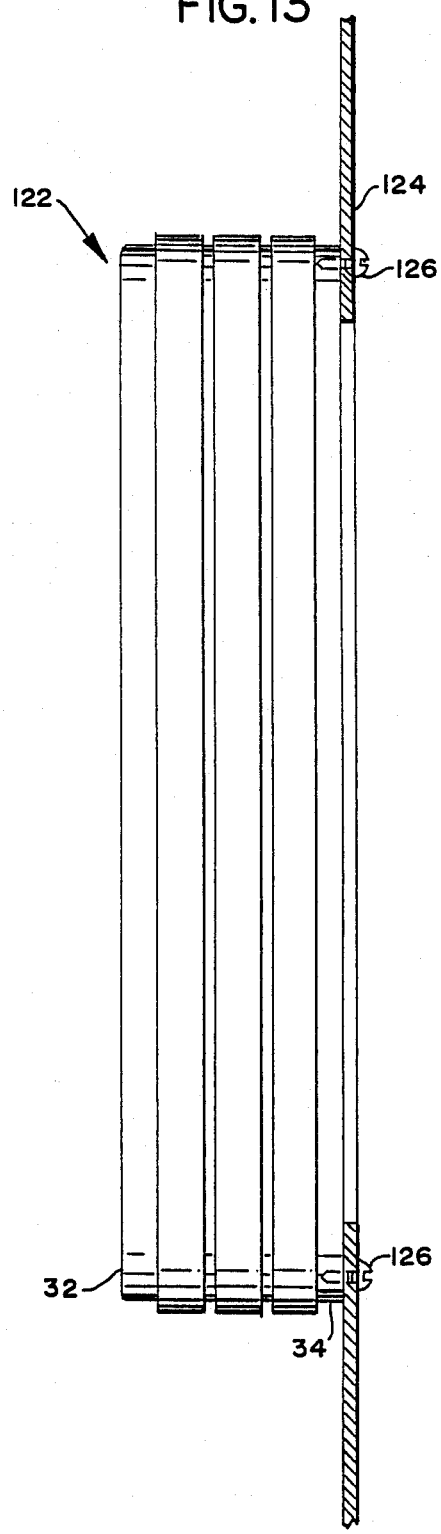
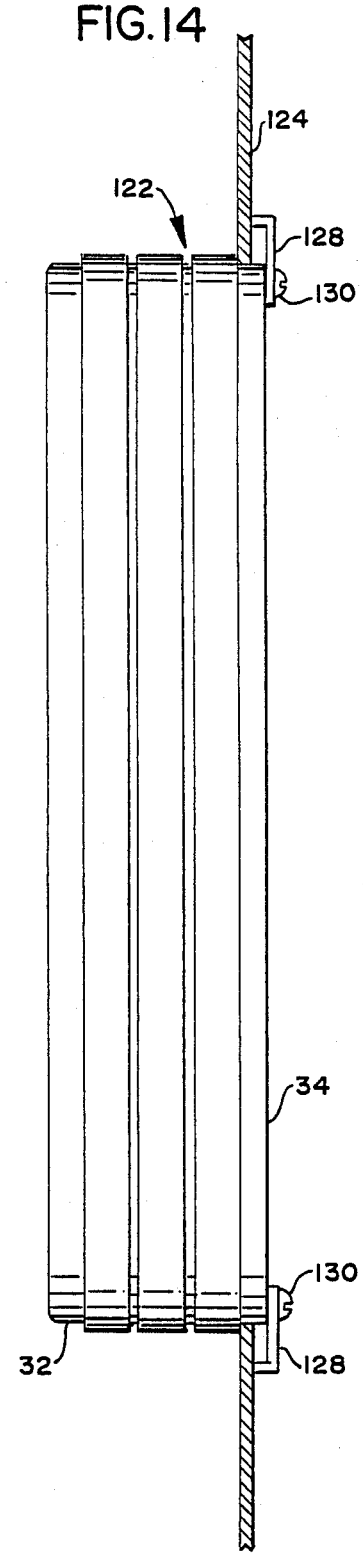

FIG. 15
FIG. 16
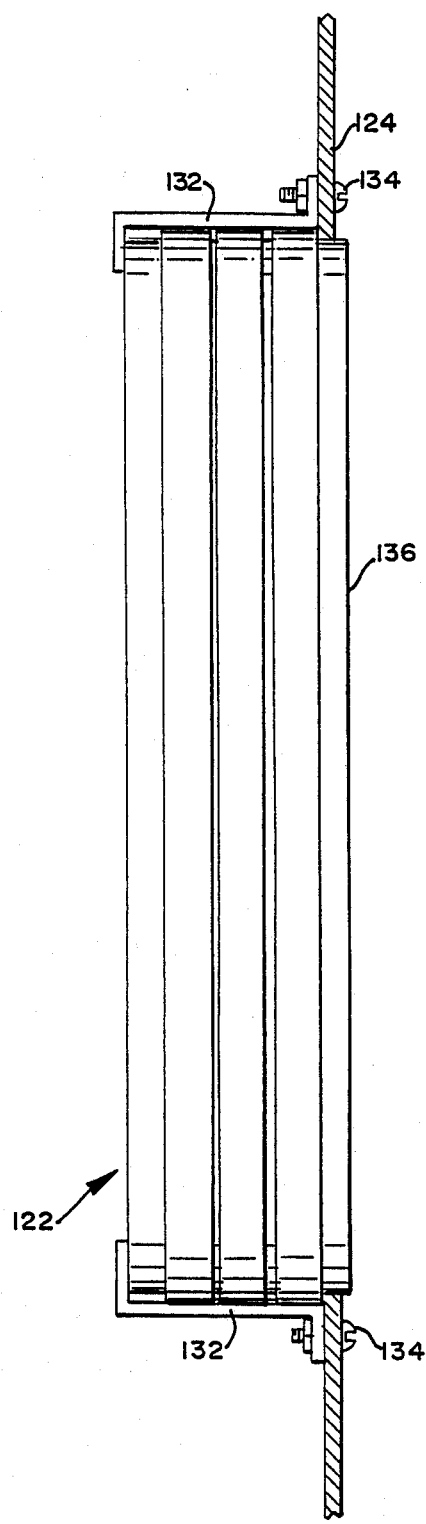
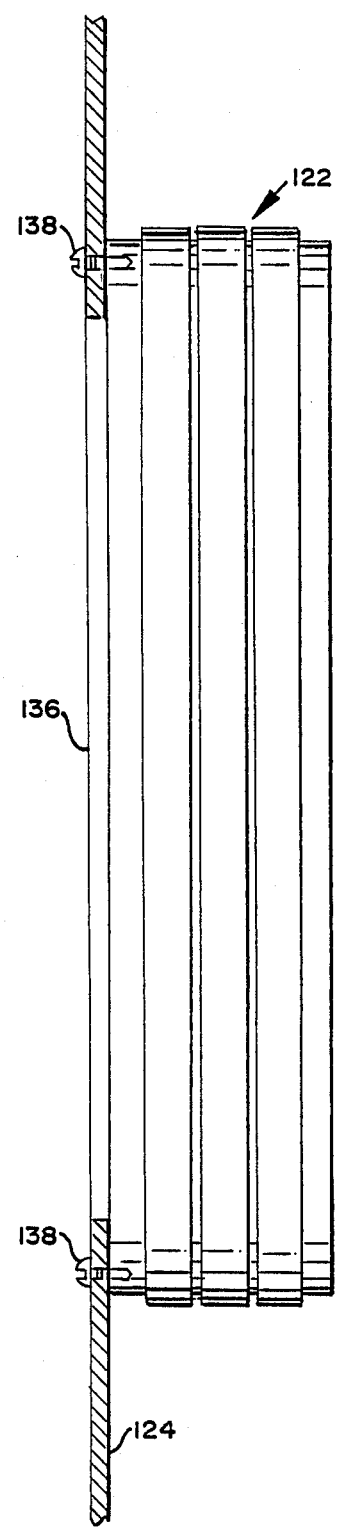

FIG.19
FIG.20
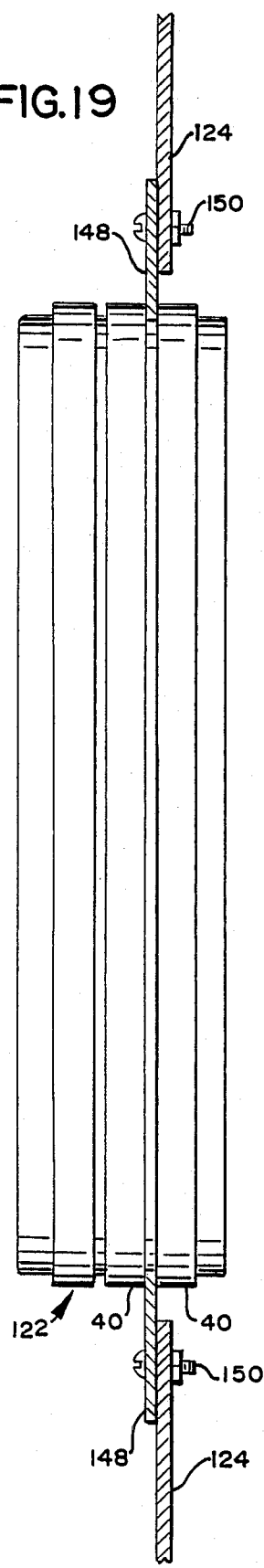
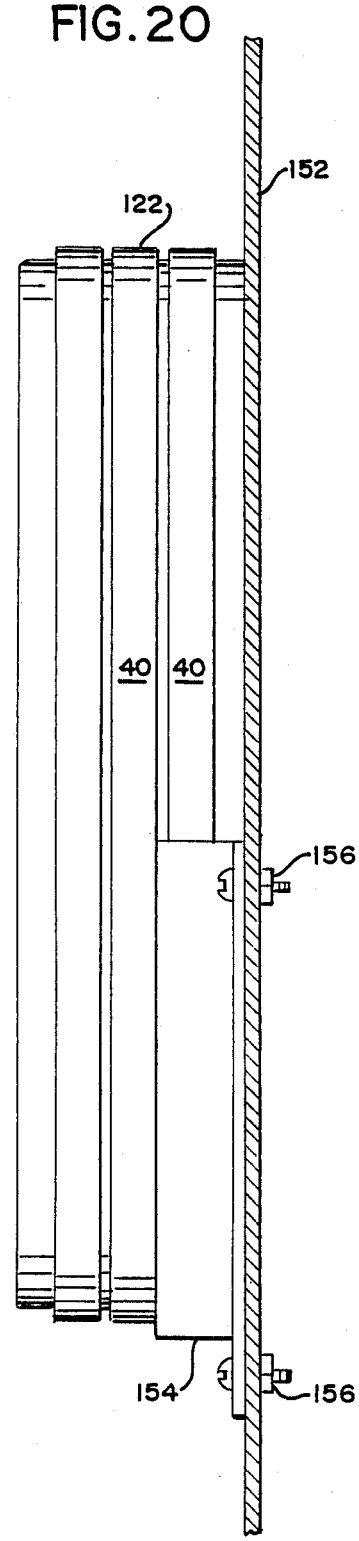

MODULAR PACKAGING SYSTEM, PARTICULARLY FOR ELECTRONICS

TECHNICAL FIELD

This application relates to the art of packaging, more particularly to the art of packaging machinery, and specifically to the art of packaging electronic equipment.

BACKGROUND ART

Although electronic components have been mounted in frames which have been connected together in accordance with the prior art, the prior art does not disclose the stacking of such frame members with a back cover and a front cover to form a sealed electronic package when the frames act as the sides of the package.

DISCLOSURE OF THE INVENTION

Now referring to FIG. 1, according to our invention, a case containing electronics, generally indicated at 30 comprises a front frame or cover plate 32, a back frame or cover 34, and may include one or more intermediate frames 36.

The frames 36 are identical and the front cover 32 is substantially identical to the intermediate frames 36. Thus the front cover 32 and the intermediate frames 36 are each provided with a narrower portion 38 and a wider portion 40. The narrower portion 38 is designed to fit into, that is nest in, the wider portion 40 so that the wider portions 40 provide ribs with spaces therebetween (see FIG. 7).

Referring to FIG. 2, a functional element support plate 42, which may be a printed circuit board for example, may be mounted to a flange-like portion 44 of each of the intermediate frames 36. The similar flange-like portion 46 of the front plate (FIG. 1) is used for mounting a transparent cover plate 45, a keyboard, switches, or the like. Still referring to FIG. 2, the rear cover plate 34 is provided with a recess portion 46 which may cooperate with support means as shown in FIGS. 22 and 23.

Now referring to FIGS. 8, 9, and 10, functional elements inside the case may be mounted on boards 48, 50, 52, and 54, which may be, in the case of electronics, printed circuit boards. The boards are mounted in slightly compressed elastomeric elements 56, 58, and 60 respectively. As shown in FIGS. 7, 8, 9, and 10, the front and back covers and the intermediate frame elements may be sealed by means of circumferential elastomeric O-rings 62.

Thus identical parts may be put together in various configurations as shown in FIGS. 11 and 12, to form electronic units.

As shown in FIG. 11, a handle 64 may be secured to a unit, generally indicated at 66, by a cord 68 of nylon or the like, the handle having a built in toggle or other means for tightening the cord 68 in between the ribs 40.

The ribs and recesses of the modular case according to the invention provide for a variety of ways to mount it to a panel as shown in FIGS. 13, 14, 15, and 16. The circumferential peripheral recess between the ribs 40 may be utilized to suspend a unit, generally indicated at 70 in FIG. 17, from a cord 72 of nylon or the like which is knotted at 74.

The recess 46 in the back plate 34 may be utilized to mount a unit to a panel as shown in FIG. 18, for a mounting packet as shown in FIG. 22, or for a bail 74 as shown in FIG. 23. Again, the spaces between the ribs may be utilized as shown in FIGS. 18, 19, and 20 for mounting Thus it will be seen that the modular system of the invention provides for packages or cases of a variety of thicknesses which may be mounted in a great variety of ways Also, because functional units may e mounted on the plates or boards 42 (FIG. 2) which in turn are mounted to the frames, the front cover or the back cover by means of screws as shown in FIG. 2, or by means of elastomeric pieces as shown in FIGS. 8, 9, and 10, this mounting may be effected early in the manufacturing process and the frames or covers utilized to carry the electronic or other functional elements throughout a manufacturing or assembly operation. When the case is assembled by nesting the covers and frames together, the frames and covers provide the outer sealed case.

OBJECTS OF THE INVENTION

It is therefore an object of the invention to provide a modular packaging system, particularly for electronics.

Another object of the invention is to provide such a system employing identical, or nearly identical, stacking elements.

A further object of the invention is to provide such a system providing a multitude of convenient ways to mount a package to a panel.

Still another object of the invention is to provide such a system providing for easy attachment of auxiliary devices.

A yet further object of the invention is to provide such a system which may be utilized for a great variety of packages of differing total volumes.

A yet further object of the invention is to provide such a packaging system providing easy mounting of components therein.

Still another object of the invention is to provide such a packaging system wherein components may be mounted in frames during the manufacturing assembly process and such frames become the final package.

Other objects of the invention will in part be obvious and will in part appear in this application.

The invention accordingly comprises the features of construction, particular elements, and arrangements of parts which will be exemplified in the construction hereinafter set forth. The scope of the invention will be indicated in the claims.

BRIEF DESCRIPTION OF THE DRAWINGS

For a fuller understanding of the nature and objects of the invention reference should be made to the following detailed description taken in connection with the accompanying drawings in which:

FIGS. 13, 14, 15, and 16 are side views partially in cross section showing ways in which a modular package according to the invention may be mounted to a panel;

FIGS. 18, 19, and 20, are side views partially in cross section showing further schemes for mounting a modular package according to the invention to a panel;

The same reference characters refer to the same elements throughout the several views of the drawings.

BEST MODE FOR CARRYING OUT THE INVENTION

The front and back covers 32 and 34 and the frames 36 may be made of metal but are preferably molded of an engineering plastic material such as polypropylene. The frames 36 and front cover 32 may be identical castings or moldings of metal or plastic and may be machined, provided with insets or pins, for their slightly different functions or to facilitate a good appearance of the front cover 32.

Figure 4:
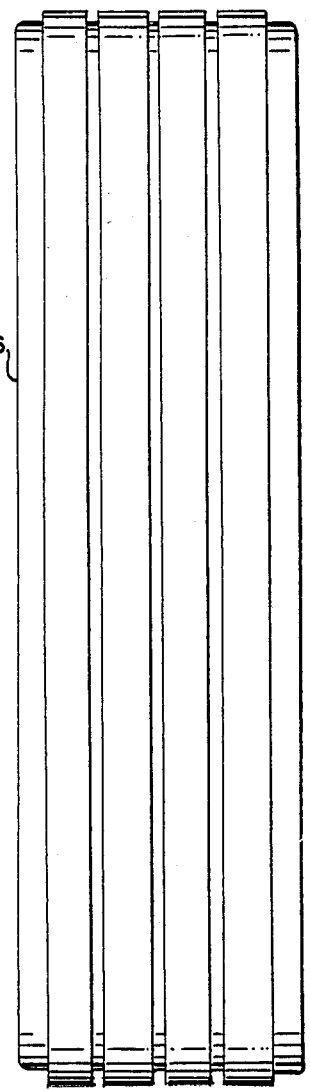
FIG. 4 is a side view thereof.
Figure 5:
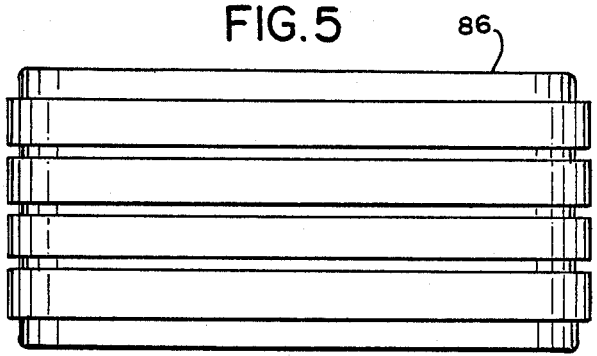
FIG. 5 is a bottom view thereof.

The narrower portion 38 of the front cover 32 in an assembled package is just matched in appearance by the peripheral edge of the back cover 34 as best shown in FIGS. 4 and 5.

Figure 1:
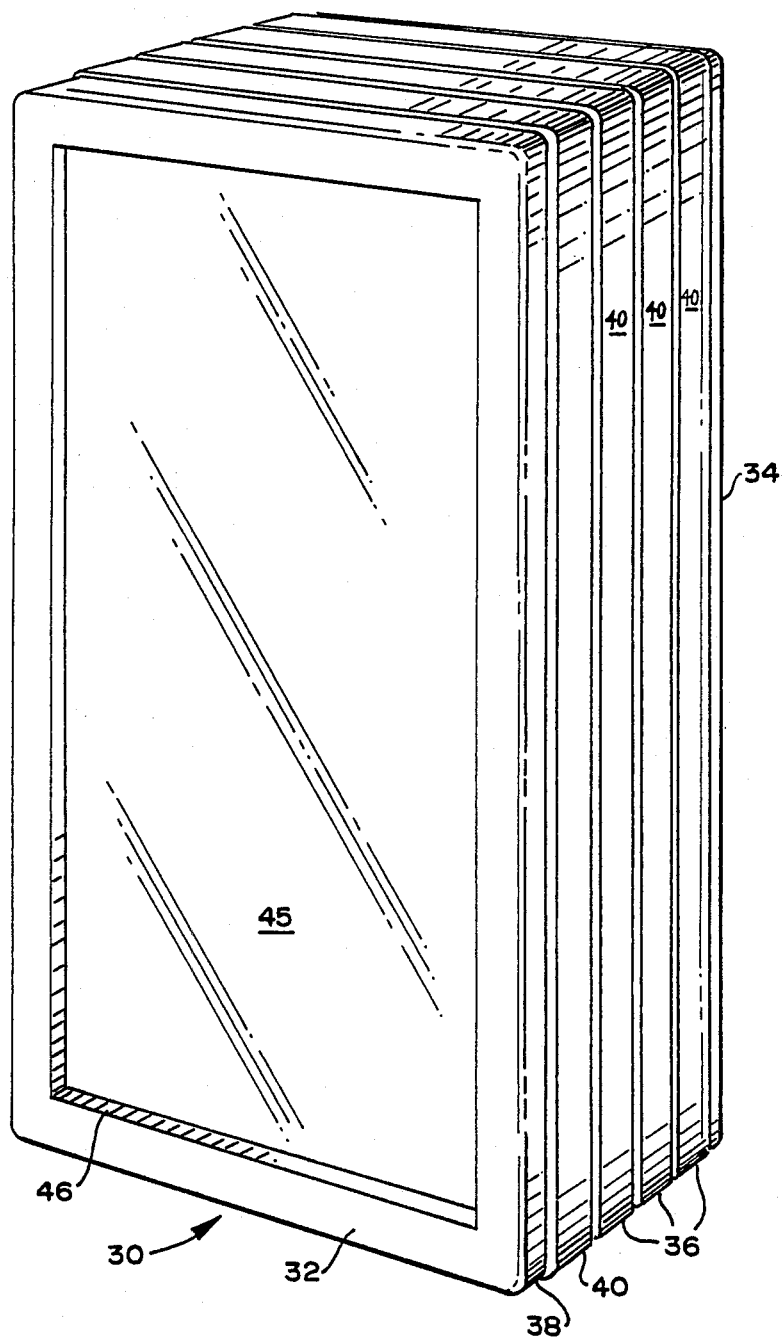
FIG. 1 is a perspective view of a modular package according to the invention.
Figure 2:
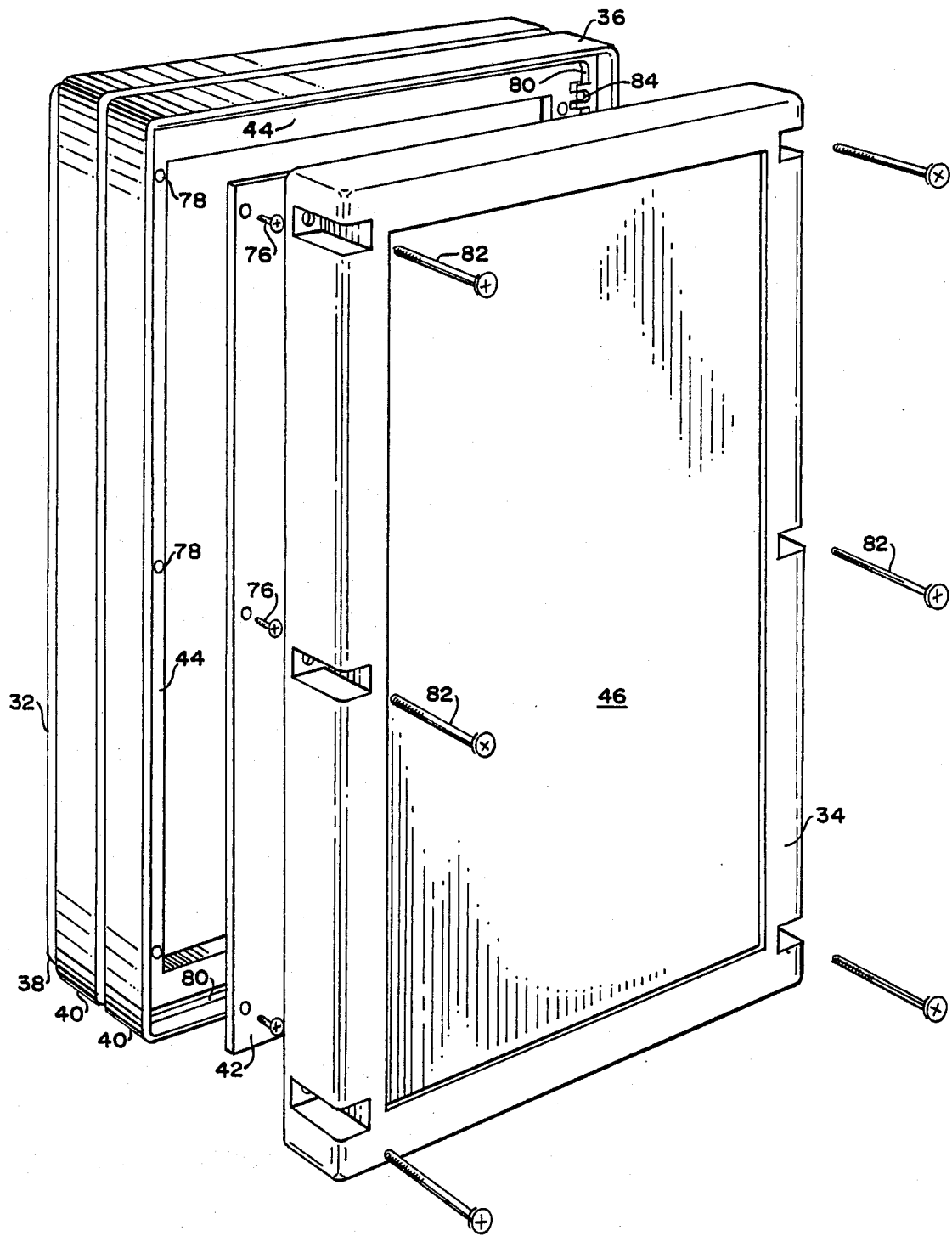
FIG. 2 is an exploded perspective view of a modular package according to the invention.

Now referring to FIG. 2, each of the frame elements 36 is provided with a flange-like portion 44, as previously described. The component mounting board 42 may be mounted to this flange by means of screws 76 fitting into holes 78 in the flange 44. This draws the board 42 flat against the flange 44. The cover plate 45 (FIG. 1) may be similarly mounted to the flange 46 of the front cover 32.

Inside each of the frames 36 (and also inside the cover 32) the flange 44 in the frames (46 in the cover) is provided with a raised peripheral shelf 80. The component mounting board 42 is dimensioned to fit within the shelf 80 flat against the flange 44 as previously stated. However, the shelf 80 provides support for the back cover 34 when a case is assembled. A similar shelf may be provided in the front cover 32 against which the narrow portions 38 of the frames 36 rest when the case is assembled.

The various elements of the case may be drawn together and sealed by means of screws 82 passing through holes 84 in the flanges 44 of the frames 36 and into inserts (not shown) in the flange 46 of the front cover 32. These inserts may be long enough to pass through the holes 84 in the intermediate frames 36.

Figure 3:
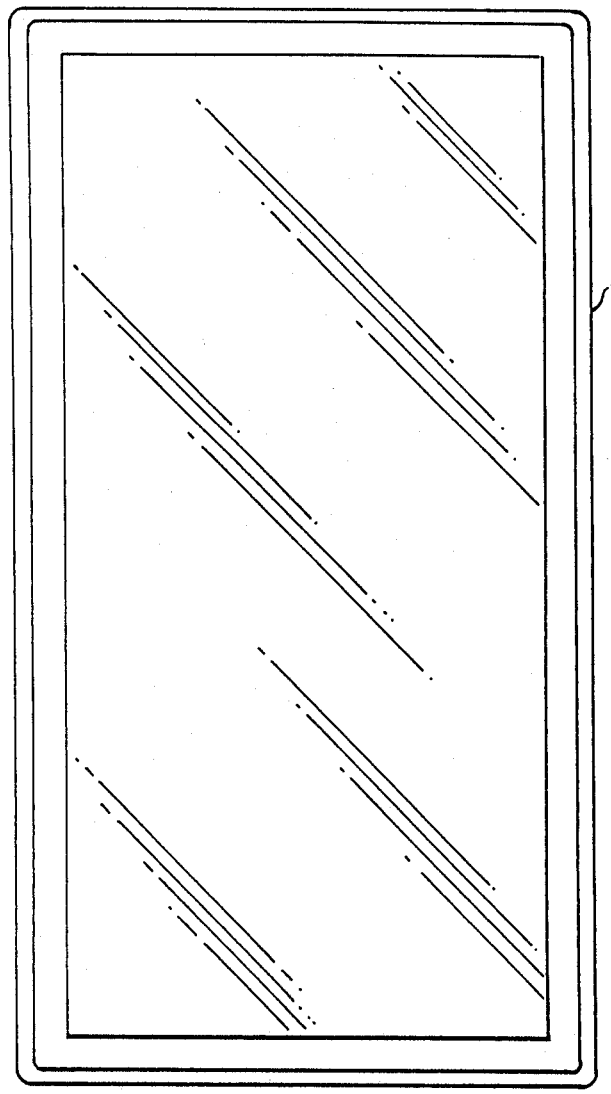
FIG. 3 is a front view of a modular package according to the invention.

Front, side and bottom views of an assembled case 86 are shown in FIGS. 3, 4 and 5 respectively.

Figure 6:
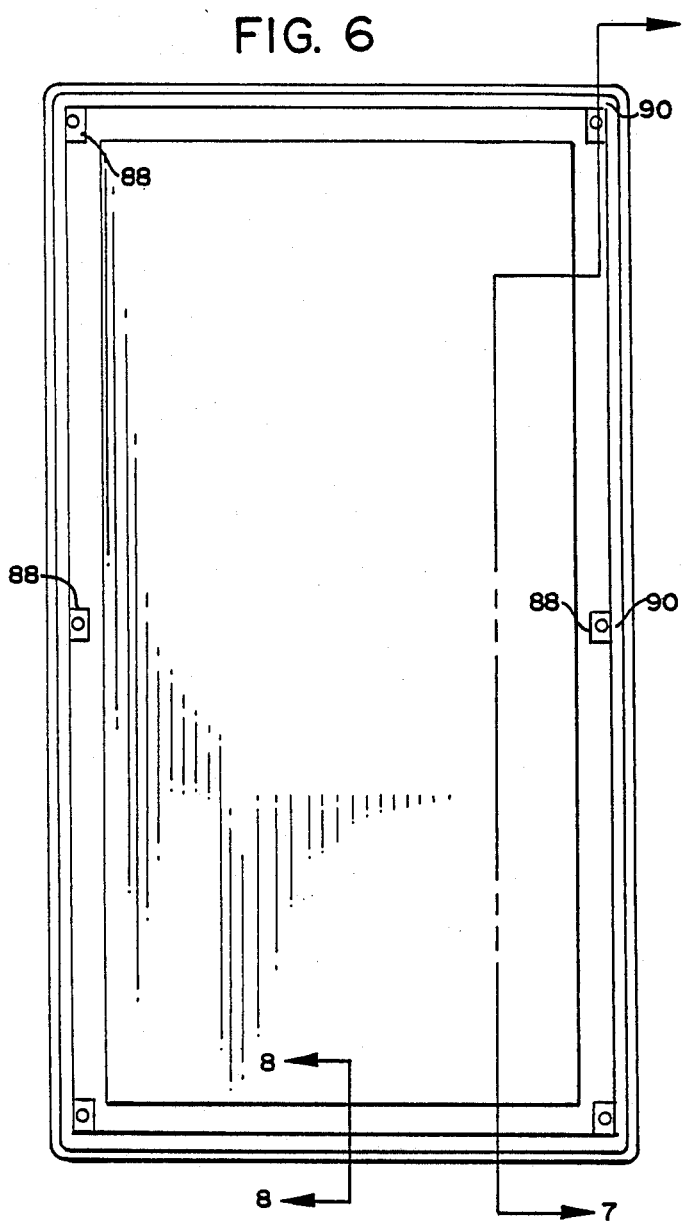
FIG. 6 is a back view of a modular package according to the invention with the rear cover removed.
Figure 7:
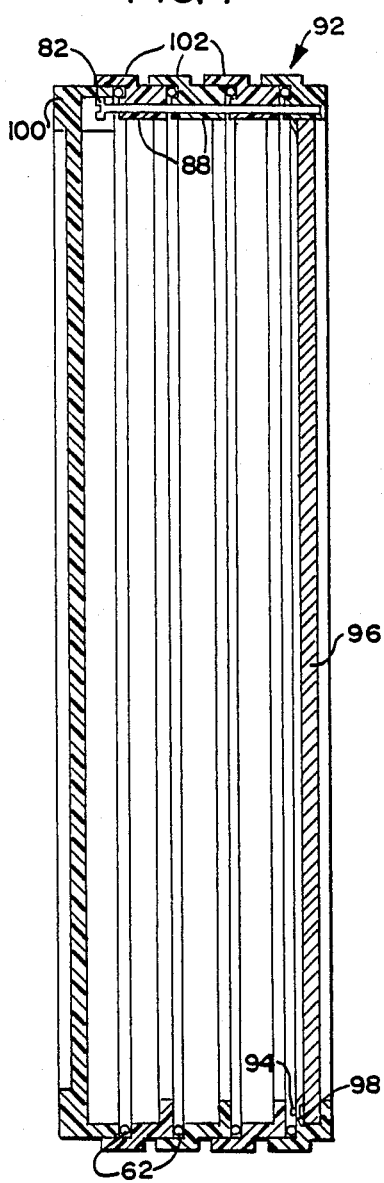
FIG. 7 is a perspective view taken along the line 7—7 of FIG. 6 with the rear cover in place.

FIG. 6 is a back view of an assembled case with the back cover removed. In this alternative embodiment the component boards are mounted in elastomeric supports 56, 58 and 60 shown in FIGS. 8, 9 and 10. The shelf 80 is dispensed with and upstanding bosses 88 are provided through which the assembling screws 82 fit. Each of the bosses is provided with a groove 90 to which the O-ring 62 can be assembled before assembling the frames and covers together. The front cover 92 is provided with a threaded insert to hold the screw 82. It is also provided with preferably integral studs 94 to which a cover plate 96 is attached by means of snap-on fasteners 98. Thus, when assembled, the front cover 92 and back cover 100, together with the identical side frames 102 form a hermetically sealed unit through the use of the O-rings 62.

Figure 8:
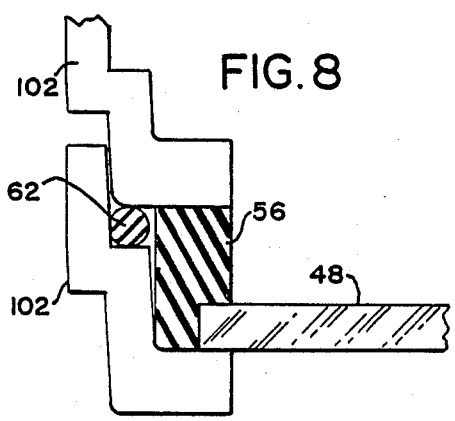
FIG. 8 is an enlarged fragmentary cross sectional view taken along the line 8—8 of FIG. 6 showing a component scheme.
Figure 9:
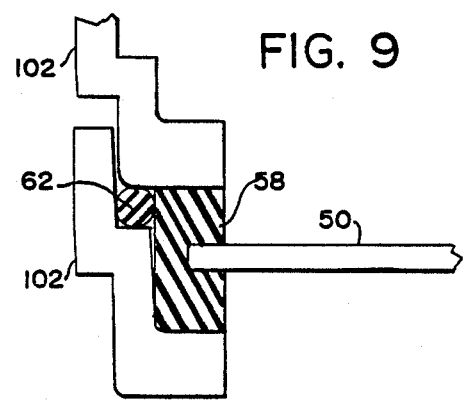
FIG. 9 is an enlarged fragmentary cross sectional view similar to FIG. 8 showing an alternative component mounting scheme.
Figure 10:
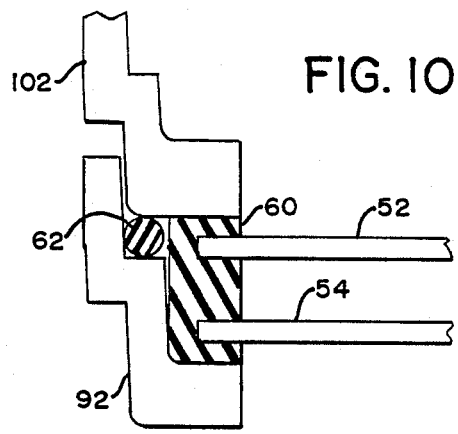
FIG. 10 is an enlarged cross sectional view similar to FIG. 8 showning another alternative component mounting scheme.

As shown in FIGS. 8, 9 and 10, the component boards 48, 50, 52 and 54 may be mounted between adjacent frames 102, or a frame 102 and a front cover 92 (FIG. 10) through the use of elastomeric strips or inserts 56, 58 and 60 which have slots cut in them to accommodate the boards 48, 50, 52 and 54. The elastomeric strips fit between the bosses 88. The mounting means of FIGS. 8, 9 and 10 provide ideal shock mounting for electronic components.

Figure 11:
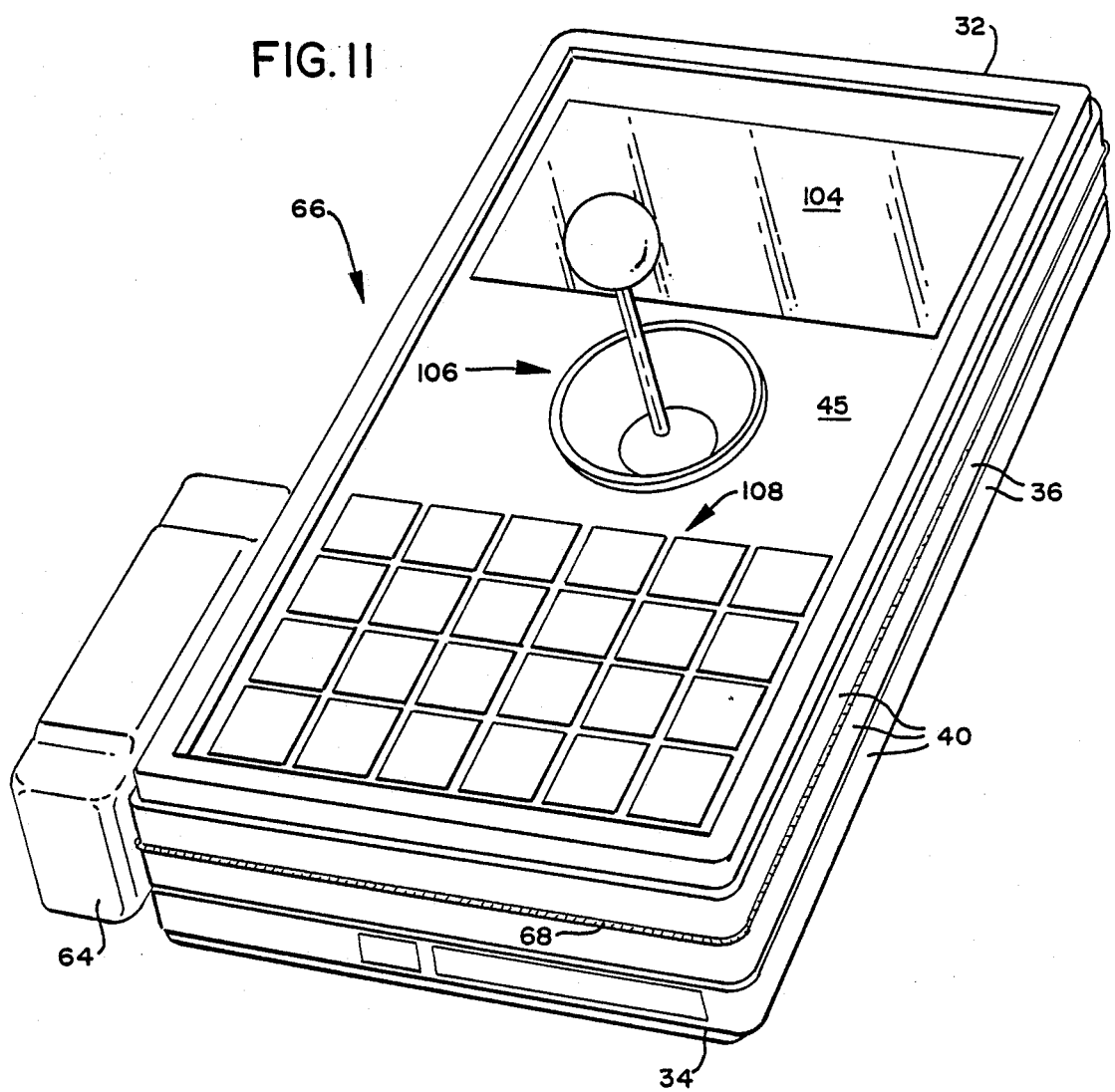
FIG. 11 is a perspective view of a modular electronics package according to the invention.

Now referring to FIG. 11, a handheld control unit 66 thus may comprise a pair of frames 40, a front cover 32 and a rear cover 34.

The front plate 45 may be provided with a transparent area 104 for a display 104, a joy stick generally indicated at 106, and a keyboard generally indicated at 108. The handle 64 for this handheld unit 66 is affixed to it by means of a nylon cord 68 which may be tightened by a turn-buckle (not shown) in handle 64 or by a toggle mechanism (also not shown).

Figure 12:
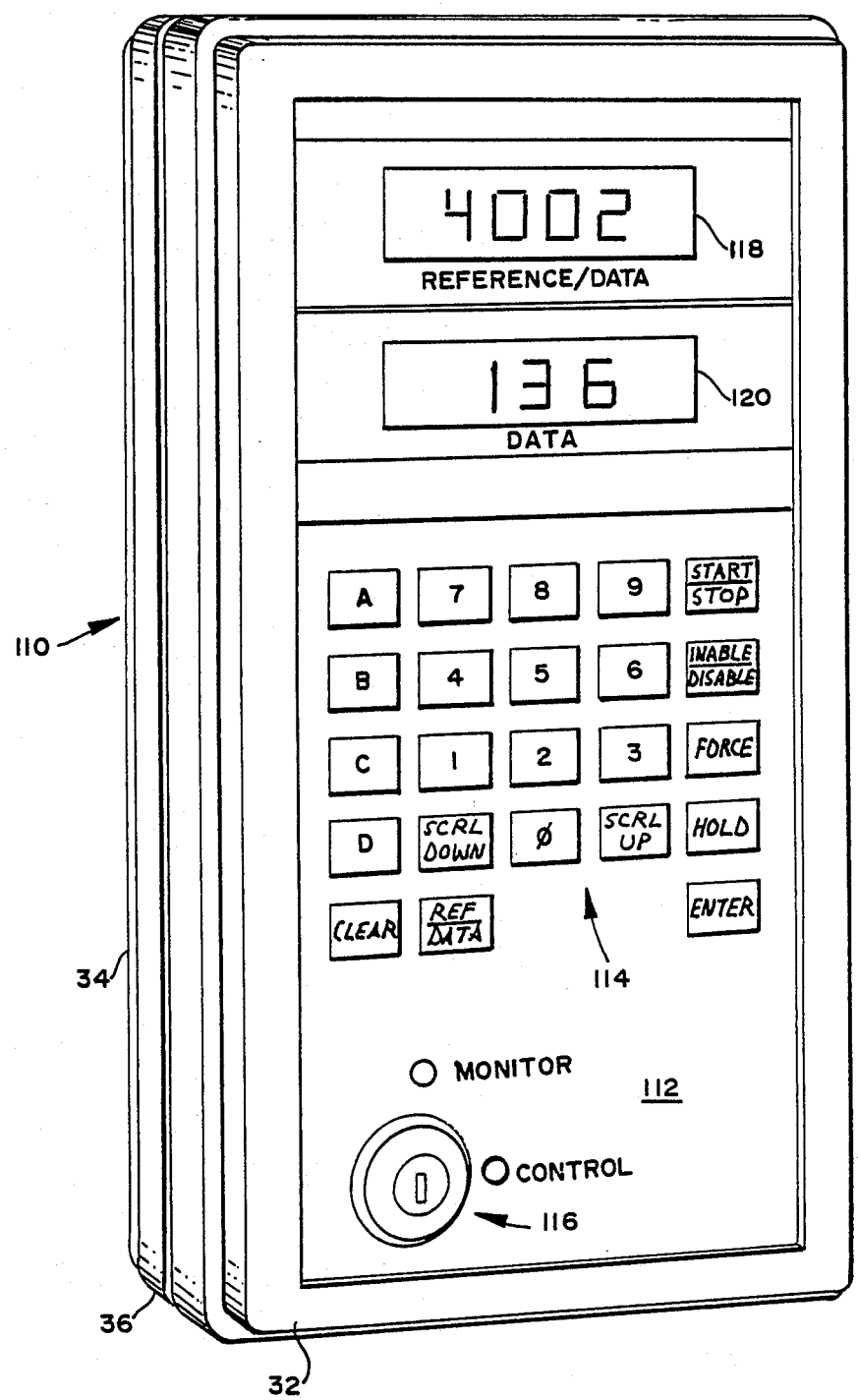
FIG. 12 is an enlarged perspective view of another modular electronics package according to the invention.

Another unit 110 may take the form shown in FIG. 12. Here one front cover 32, one intermediate frame 36 and a back cover 34 form the unit's case. The front panel 112 carries a keyboard generally indicated at 114, a keyswitch generally indicated at 116 and two displays 118 and 120.

Now referring to FIG. 13, a case according to the invention generally indicated at 122 may be mounted directly to a panel 124 by means of screws 126 tapped into the back cover 34, the front cover 32 facing to the left.

In FIG. 14 it may be seen how the back cover 34 may be recessed into the panel 124 and the unit 122 mounted by means of brackets 128 and screws 130 with the front cover 32 facing to the left.

In FIG. 15 another scheme for mounting the unit 122 to a panel 124 is shown. Here the brackets 132 encompass substantially the entire unit 122 and are mounted by screws 134. Portion 136 may be the front or the back of the unit as desired.

Similarly, in FIG. 16 the unit 122 may be attached directly by means of screws 138 to the panel 124 and again the portion 136 may be the front or the back of the unit as desired.

Figure 17:
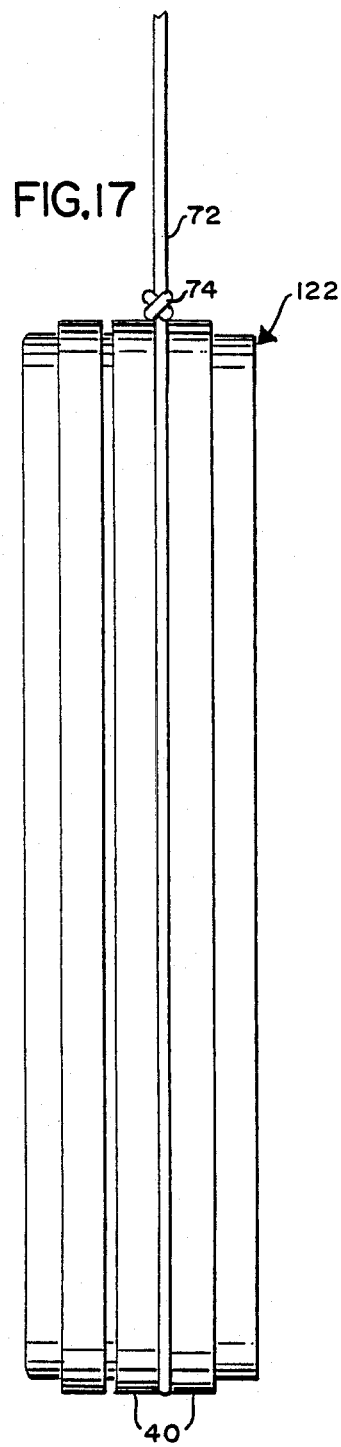
FIG. 17 is a side view of a modular package according to the invention suspended from above.

In FIG. 17 the unit 122 is shown suspended from a nylon cord 72 which passes around the unit and in the recess between ribs 40, the cord being knotted at 74.

Thus a unit may be suspended from a piece of machinery or from a ceiling.

Figure 18:
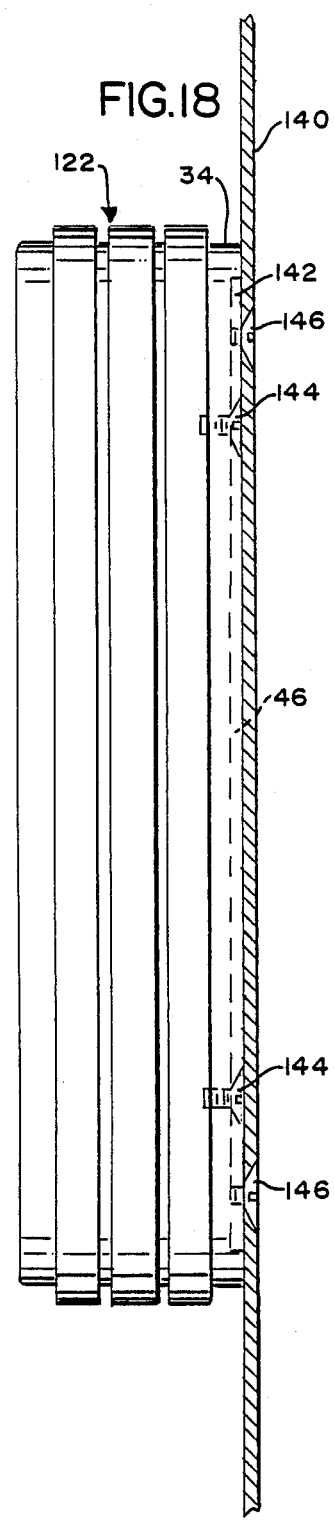

The unit may be mounted to a panel 140 without cutting a hole in the panel as shown in FIG. 18. First a plate 142 is mounted in recess 46 in the rear cover 34 by means of screws 144 and then the unit 122 is attached to panel 140 by means of screws 146 screwed into plate 142.

In another mounting scheme, shown in FIG. 19, a peripheral plate 148 is assembled with the unit 122 between ribs 40. Plate 148 may then be affixed to a panel 124 by means of screws 150.

Figure 21:
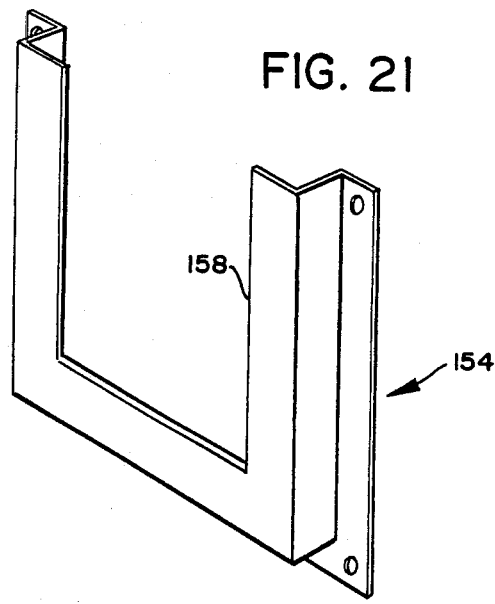
FIG. 21 is a perspective view of one of the elements shown in FIG. 20.
Figure 22:
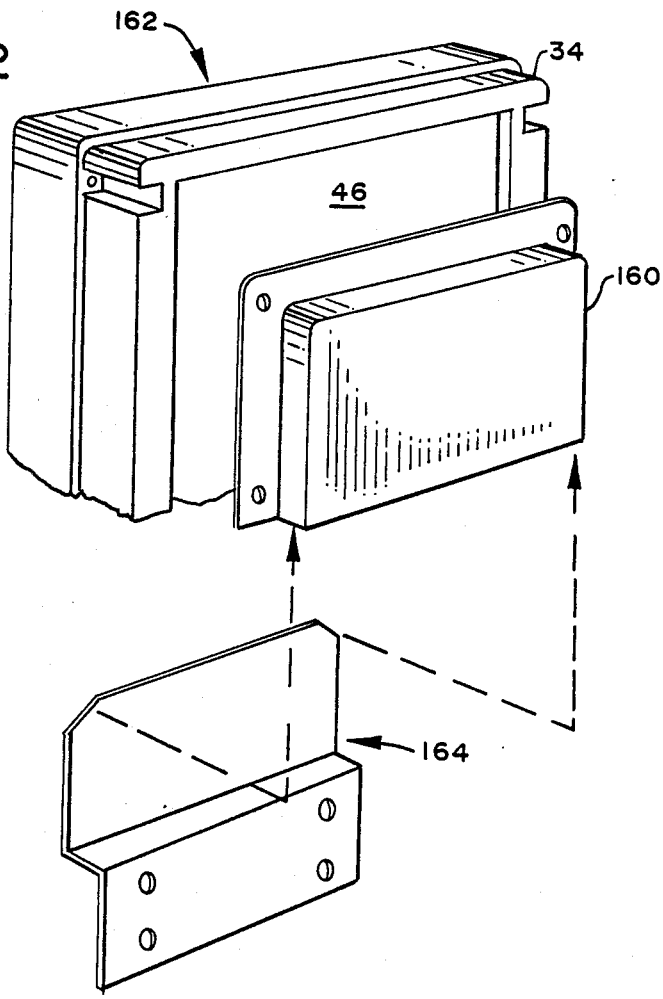
FIG. 22 is a fragmentary exploded perspective view of another mounting scheme for an electronics package according to the invention.

A unit 122 may be temporarily mounted to a panel 152 by any number of schemes, two of which are shown in FIGS. 20, 21 and 22.

In FIGS. 20 and 21 a U-shaped metal holster 154 is affixed to panel 152 by means of screws 156, the holster 154 being provided with a U-shaped flange 158 which fits between the ribs 40 of the unit 122.

Alternatively a holster 160 may be mounted into the recess 46 in the back cover 34 of a unit 162 and an upstanding flange 164 mounted to a panel (not shown), the holster 160 fitting over the flange 164 when the unit 162 is mounted to the panel.

Figure 23:
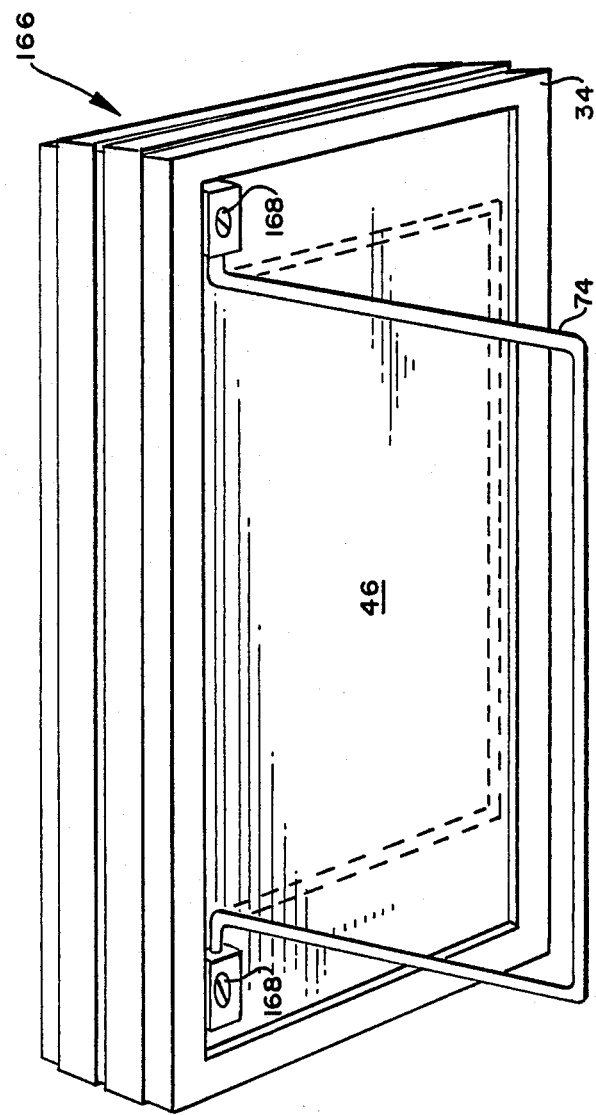
FIG. 23 is a perspective view showing how a modular package according to the invention may accommodate a bail stand.

A unit may be placed upon a flat surface like a picture frame as shown in FIG. 23, the unit 166 being provided with a bail 74 affixed by means of screws 168 in the recess 46 of the back cover 34.

Those skilled in the art will realize that by providing two or three molded elements, one of which may be duplicated any number of time in a given package to increase its volume, we have provided an extremely versatile modular packaging system for electronic and other apparatus. Furthermore, by providing such packaging with circumferential peripheral ribs, we have provided for a great variety of mounting schemes and for each of mounting external apparatus such as handles to cases formed using our modular system.

It will thus be seen that the objects set forth above among those made apparent from the preceding description are efficiently attained, and since certain changes may be made in the above constructions without departing from the scope of the invention it is intended that all matter contained in the above description or shown in the accompanying drawings shall be interpreted as illustrative and not in a limiting sense. It is also to be understood that the following claims are intended to cover all of the generic and specific features herein described, and all statement of the scope of the invention which as a matter of language might be said to fall therebetween.

Having described our invention, what we claim as new and desire to secure by Letters Patent is:

1. A modular packaging system for electrical components comprising:
   (A) a pair of nested substantially identical frame-like members;
   (B) means for mounting at least one printed electrical circuit board to at least one of said frame-like members; and,
   (C) a back cover nested with the rearmost one of said members,
   said frame-like members providing spaces peripheral flanges about the sides of a package.

2. A modular packaging system as defined in claim 1 wherein said substantially identical frame-like members form closed sides of a package.

3. A modular package for electrical components comprising:
   (A) a front cover;
   (B) one or more nested substantially identical frame-like members forming the sides of the package, the foremost of said frame-like members nesting with said cover;
   (C) means for mounting at least one printed electrical circuit board to at least one of said frame-like members; and,
   (D) a back cover nesting with the rearmost of said frame-like members,
   said frame-like members providing spaced peripheral flanges about the sides of said package.

4. That which is claimed in claims 1, 2 or 3 wherein said frame-like members present a cross section which is shaped substantially like two "L"'s, the end of the lower horizontal portion of the "L" flowing into the vertical end of the other "L".

5. That which is claimed in any of claims 1, 2, or 3 wherein said printed electrical circuit boards are held in said frame-like members by slotted elastomeric inserts.

6. A modular packaging system comprising:
   (A) a pair of nested substantially identical frame-like members forming closed sides of a package;
   (B) means for mounting at least one printed electrical circuit board to at least one of said frame-like members; and,
   (C) a back cover nested into the rearmost one of said members,
   said frame-like members providing spaced peripheral flanges about the sides of a package.

7. A modular packaging system as defined in claims 1, 3, or 6 wherein said back cover provides a peripheral flange about the sides of the package.

8. A modular packaging system as defined in claim 7 wherein said package is supported by a peripheral support between a pair of said flanges.

9. A modular packaging system as defined in claim 7 wherein said package is mounted to a cut out in a panel with the panel engaged with one of said flanges.

10. A modular packaging system as defined in claims 1, 3 or 6 wherein said package is supported by a peripheral support between a pair of said flanges.

11. A modular packaging system as defined in claims 1, 3 or 6 wherein said package is mounted to a cut out in a panel with the panel engaged with one of said flanges.

12. A modular packaging system as defined in claim 6 wherein said front cover provides a peripheral flange about the sides of the package.

13. A modular packaging system as defined in claim 12 wherein said package is supported by a peripheral support between a pair of said flanges.

14. A modular packaging system as defined in claim 12 herein said package is mounted to a cut out in a panel with the panel engaged with one of said flanges.

* * * * *